(12) United States Patent
Koeck et al.

(10) Patent No.: US 11,137,456 B2
(45) Date of Patent: *Oct. 5, 2021

(54) FREQUENCY INCREASING SENSOR PROTOCOL IN MAGNETIC SENSING

(71) Applicant: Infineon Technologies AG, Neubiberg (DE)

(72) Inventors: Helmut Koeck, Villach (AT); Simon Hainz, Villach (AT); Dirk Hammerschmidt, Finkenstein (AT)

(73) Assignee: Infineon Technologies AG

( * ) Notice: Subject to any disclaimer, the term of this patent is extended or adjusted under 35 U.S.C. 154(b) by 0 days.

This patent is subject to a terminal disclaimer.

(21) Appl. No.: 16/906,142

(22) Filed: Jun. 19, 2020

(65) Prior Publication Data

US 2020/0319271 A1  Oct. 8, 2020

Related U.S. Application Data

(63) Continuation of application No. 15/686,307, filed on Aug. 25, 2017, now Pat. No. 10,718,827.

(51) Int. Cl.
*G01R 33/07* (2006.01)

(52) U.S. Cl.
CPC ........... *G01R 33/07* (2013.01); *G01R 33/072* (2013.01)

(58) Field of Classification Search
CPC ...... G01R 33/09; G01R 33/07; G01R 35/005; G01R 3/00; G01R 33/072
See application file for complete search history.

(56) References Cited

U.S. PATENT DOCUMENTS

| | | | |
|---|---|---|---|
| 2007/0018642 A1* | 1/2007 | Ao ....................... | G01D 11/245 324/252 |
| 2008/0218159 A1* | 9/2008 | Hinz .................... | G01D 5/2451 324/207.21 |
| 2009/0174395 A1* | 7/2009 | Thomas ............... | G01D 5/2448 324/207.2 |
| 2010/0072988 A1* | 3/2010 | Hammerschmidt . | G01R 33/093 324/207.25 |
| 2012/0207226 A1* | 8/2012 | Gohshi ............... | G10L 19/0212 375/240.25 |
| 2015/0377646 A1* | 12/2015 | Meyer ................ | G01R 33/0023 324/207.25 |

* cited by examiner

*Primary Examiner* — Jermele M Hollington
*Assistant Examiner* — Taqi R Nasir
(74) *Attorney, Agent, or Firm* — Design IP

(57) ABSTRACT

A magnetic sensor is configured to measure a magnetic field whose magnitude oscillates between a first extrema and a second extrema. The magnetic sensor includes a plurality of magnetic field sensor elements, each configured to generate a sensor signal in response to the magnetic field impinging thereon. The plurality of sensor elements are grouped into a first group from which a first measurement signal is derived and a second group from which a second measurement signal is derived, and the first measurement signal and the second measurement signal having a phase difference based on different phases. The magnetic sensor further includes a sensor circuit configured to receive the first measurement signal and the second measurement signal, and apply a signal conversion algorithm thereto to generate a converted measurement signal having an increased frequency with respect to the first measurement signal and the second measurement signal.

32 Claims, 15 Drawing Sheets

FREQUENCY INCREASING SENSOR PROTOCOL IN MAGNETIC SENSING

CROSS-REFERENCE TO RELATED APPLICATIONS

This application is a continuation of U.S. patent application Ser. No. 15/686,307 filed Aug. 25, 2017, which is incorporated by reference as if fully set forth.

FIELD

The present disclosure relates generally to magnetic sensors, and, more particularly, to magnetic sensors configured to increase a frequency of a sensor protocol and methods for implementing the same.

BACKGROUND

Today, vehicles feature numerous safety, body and powertrain applications that rely on magnetic position and/or angle sensors. For example, in Electric Power Steering (EPS), magnetic angle sensors and linear Hall sensors can be used to measure steering angle and steering torque. Modern powertrain systems can rely on magnetic speed sensors for camshaft, crankshaft and transmission applications, along with automotive pressure sensors, to achieve required $CO_2$ targets and smart powertrain solutions.

In the field of speed sensing, a sinusoidal signal may be generated by a magnetic sensor in response to a rotation of a target object, such as a wheel, camshaft, crankshaft, or the like. The sinusoidal signal may be translated into pulses, which is further translated into a movement detection or a speed output. Both anti-lock braking system (ABS) applications and transmission applications, for example, have a trend for requiring more pulses per revolution for increased accuracy. In both ABS and transmission applications it is desired that the number of pulses per revolution be increased by a factor 2, 4, or even higher.

In the field of position sensing, in a similar sense, sinusoidal signals may be used to calculate accurate angle information, for example, for steering wheel position sensing. For position sensing, a higher degree of resolution is desired.

Currently, higher accuracy requirements in speed sensing applications may be realized with an increase of number of poles or teeth on a target object. However, the number of poles or teeth on a target object depends on the object diameter and, in general, there is a technical limit to the minimum size of a single pole or tooth. In addition, the higher the number of pole pairs or tooth/notches, the higher the manufacturing costs. Thus, increasing the numbers of poles or teeth relates in a trade of between cost and accuracy. In addition, an increase in the number of poles or teeth may also increase bandwidth requirements.

Therefore, an improved sensing device without increasing the number or poles or teeth of a sensing target may be desirable.

SUMMARY

Magnetic field sensors and sensing methods are provided.

Embodiments provide a magnetic sensor configured to measure a magnetic field whose magnitude oscillates between a first extrema and a second extrema. The magnetic sensor includes a plurality of magnetic field sensor elements, each configured to generate a sensor signal in response to the magnetic field impinging thereon. The plurality of sensor elements are grouped into a first group from which a first measurement signal is derived and a second group from which a second measurement signal is derived, and the first measurement signal and the second measurement signal having phase difference of 90°. The magnetic sensor further includes a sensor circuit configured to receive the first measurement signal and the second measurement signal, and apply a signal conversion algorithm thereto to generate a converted measurement signal having an increased frequency with respect to a frequency of the first measurement signal and the second measurement signal.

Embodiments further provide a method for measuring a magnetic field whose magnitude oscillates between a first extrema and a second extrema. The method includes generating a first measurement signal representing the measured magnetic field; generating a second measurement signal representing the measured magnetic field, wherein the first measurement signal and the second measurement signal have a phase difference of 90°; and applying a signal conversion algorithm to the first measurement signal and the second measurement signal in order to generate a converted measurement signal having an increased frequency with respect to a frequency of the first measurement signal and the second measurement signal.

BRIEF DESCRIPTION OF THE DRAWINGS

Embodiments are described herein making reference to the appended drawings.

DETAILED DESCRIPTION

Figure 1:
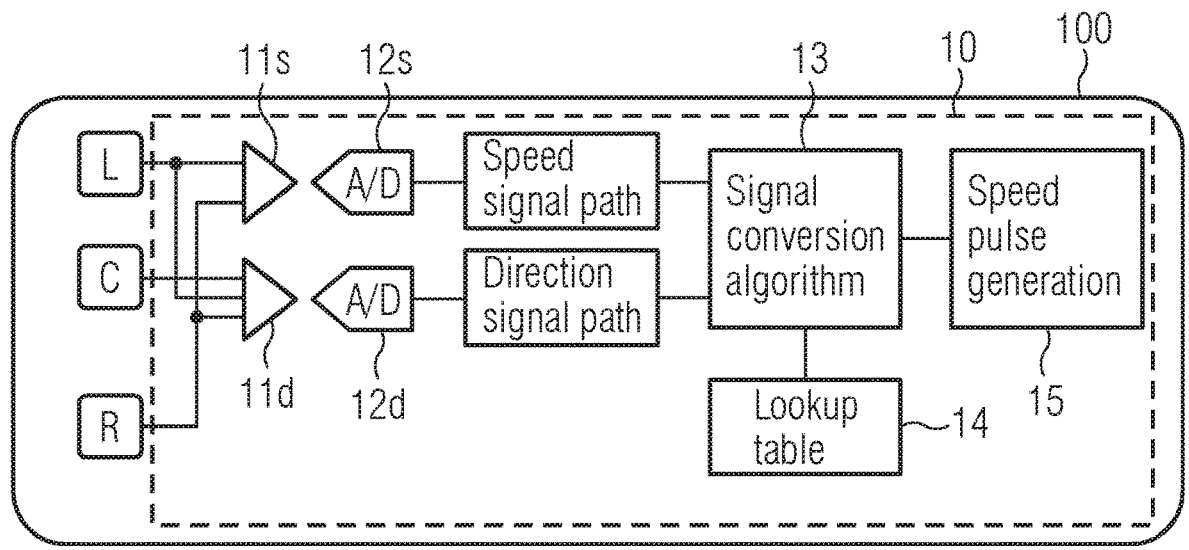
FIG. 1 is a block diagram illustrating a magnetic speed sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may be used interchangeably throughout this description.

Magnetic sensors include magnetoresistive sensors and Hall-effect sensors (Hall sensors), for example. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current and direction of magnetization is observed. For example, in the case of AMR sensors, a resistance for an AMR sensor element changes according to a square of a sine of an angle of the magnetic field component projected on a sensing axis of the ARM sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction). The reference magnetization provides a sensing direction corresponding to a sensing axis of the xMR sensor. Accordingly, if a magnetic field component points exactly in the same direction as the reference direction, a resistance of the xMR sensor element is at a maximum, and, if a magnetic field component points exactly in the opposite direction as the reference direction, the resistance of the xMR sensor element is at a minimum.

In some applications, an xMR sensor includes a plurality of magnetoresistive sensor elements, which have different reference magnetizations. Examples of such applications, in which various reference magnetizations are used, are angle sensors, compass sensors, or specific types of speed sensors (e.g., speed sensors in a bridge arrangement referred to as monocells).

By way of example, such magnetoresistive sensor elements are used in speed, angle or rotational speed measuring apparatuses, in which magnets may be moved relative to an magnetoresistive sensor elements and hence the magnetic field at the location of the magnetoresistive sensor element changes in the case of movement, which, in turn, leads to a measurable change in resistance. For the purposes of an angle sensor, a magnet or a magnet arrangement may be applied to a rotatable shaft and an xMR sensor may be arranged stationary in relation thereto.

A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for proximity switching, positioning, speed detection, and current sensing applications.

In some examples, Hall sensor elements may be implemented as a vertical Hall sensor elements. A vertical Hall sensor is a magnetic field sensor which is sensitive to a magnetic field component which extends parallel to their surface. This means they are sensitive to magnetic fields parallel, or in-plane, to the IC surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

In other examples, Hall sensor elements may be implemented as lateral Hall sensor elements. A lateral Hall sensor is sensitive to a magnetic field component perpendicular to their surface. This means they are sensitive to magnetic fields vertical, or out-of-plane, to the integrated circuit (IC) surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package. The sensor package may be combined with a back bias magnet to form a sensor module, sensor device, or the like.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. Therefore, the sensor package may include a circuit that conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

FIG. 1 is a block diagram illustrating a magnetic speed sensor 100 according to one or more embodiments. The magnetic speed sensor 100 includes sensor elements L, C, and R that are configured to generate a sensor signal in response to a magnetic field impinging thereon. The sensor elements L, C, and R are configured to measure a same field component (e.g., an x-component, a y-component, or a z-component) of a magnetic field according to their sensing axis. The sensor elements L, C, and R may be arranged such that sensor element L and sensor element R are set apart from each other, for example, by a distance equal to half a pitch of the poles or teeth of a target object (e.g., a magnetic encoder wheel or a tooth and notch wheel), and the sensor element C is disposed therebetween.

The magnetic speed sensor 100 also includes a sensor circuit 10 that receives the sensor signals from the sensor elements L, C, and R for processing and for generation of a speed output signal. The sensor circuit 10 includes two signal paths: a speed signal path and a direction signal path. The signal on the speed signal path may be in a form of a sinusoidal (sine) waveform that represents a rotation of the target object, and the signal on the direction signal path may be a similar waveform that is shifted 90° from the speed signal. That is, the direction signal is a sinusoidal (cosine) waveform that represents a rotation of the target object. It will be appreciated that while the examples herein describe the sine waveform as being used as the speed signal and the cosine waveform as being used as the direction signal, the opposite may also be true so long as the two signals are phase shifted 90° from each other.

The speed signal path of the sensor circuit 10 may include combining circuitry 11s that receives sensor signals from sensor elements L and R and generates a differential measurement signal therefrom. For example, the combining circuitry 11s may include one or more differential amplifiers that outputs the difference between sensor elements L and R (e.g., L-R). The differential measurement signal of the speed signal path may be represented as a sinusoidal (sine) signal and may be referred to herein as a speed signal that corresponds a rotation of the target object. A differential measurement signal provides robustness to homogenous external stray magnetic fields.

In addition, the speed signal path may include an ADC 12s that converts the differential measurement signal of the speed signal path into a digital signal for further processing by a remaining portion of the sensor circuit 10.

It will be appreciated that other logic and circuitry other than or in combination with a differential amplifier may be used as the combining circuitry 11s to generate the differential measurement signal, or other combinations of sensor signals from sensor elements L, C, and R may be used to generate the speed signal. For example, the measurement signal may be a differential measurement signal, derived from two sensor signals using differential calculus.

Additionally, it will also be appreciated that combining circuitry 11s is optional, and that one of the sensor signals from one of the sensor elements L, C or R may be used as a monocell and may be directly applied to the ADC and used as the speed signal.

The direction signal path of the sensor circuit 10 may include combining circuitry 11d that receives sensor signals from sensor elements L, C, and R and generates a differential measurement signal therefrom. For example, the combining circuitry 11d may include one or more differential amplifiers that outputs the difference between sensor elements C and R (e.g., C-R). The differential measurement signal of the direction signal path may be represented as a cosine signal and may be referred to herein as a direction signal that corresponds a rotation of the target object. Thus, the direction signal is a similar waveform to that of the speed signal, but is phase shifted 90° from the speed signal.

In some cases, the direction signal may have a smaller extrema (i.e., maximum and minimum) when compared to the speed signal. However, in this case, when the two signals are normalized to a common amplitude, it can be seen that the direction signal is similar to the speed signal, but phase shifted by 90°.

Since the speed signal and the direction signal are phase shifted from each other by 90°, a direction of rotation of the target object can be determined therefrom based on whether the phase shift is a positive or a negative 90° (i.e., via the direction of the phase shift).

In addition, the direction signal path may include an ADC 12d that converts the differential measurement signal of the direction signal path into a digital signal for further processing by a remaining portion of the sensor circuit 10.

It will be appreciated that other logic and circuitry other than or in combination with a differential amplifier may be used as the combining circuitry 11d to generate the differential measurement signal, or other combinations of sensor signals from sensor elements L, C, and R may be used to generate the direction signal.

Additionally, it will also be appreciated that combining circuitry 11d is optional, and that one of the sensor signals from one of the sensor elements L, C or R may be used as a monocell and may be directly applied to the ADC and used as the direction signal. For example, if the sensor element L is used as a monocell for generating the speed signal, sensor element C may be used as a monocell for generating the direction signal.

The sensor circuit 10 further includes a signal conversion algorithm block 13 that receives the speed signal and the direction signal for further processing. For example, the signal conversion algorithm block 13 may include one or more processors and/or logic units that performs various signal conditioning functions, such as absolute signal conversion, normalization, linearization, and so forth. One or more signal conditioning functions may be performed in combination with a lookup table stored in memory 14. The output of the signal conversion algorithm block 13 is provided a signal protocol block 15 that is configured to generate a speed pulse signal as an output signal. Each "block" may include one or more processors for processing one or more signals.

Figure 2A:
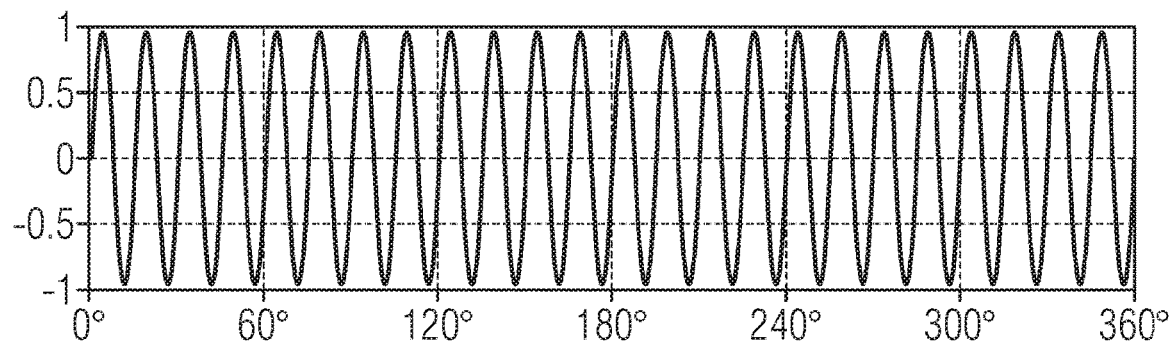
FIG. 2A is a graph showing an example of a sinusoidal waveform generated by a magnetic speed sensor according to one or more embodiments.
Figure 2B:
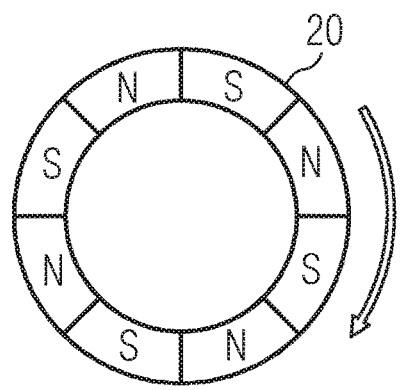
FIG. 2B is a plan view of a magnetic encoder wheel used in speed sensing according to one or more embodiments.

FIG. 2A is an example of a sinusoidal waveform generated by a magnetic speed sensor according to one or more embodiments. FIG. 2B is a plan view of a magnetic encoder wheel 20 that is configured to rotate about an axis according to one or more embodiments. In particular, FIG. 2A shows a full revolution speed sensor signal response of one full revolution of the magnetic encoder wheel 20. The speed sensor signal response may be a sensor signal generated by a signal sensor element (e.g., L, C, or R) or may be a differential measurement signal described above.

A pole pair includes adjacent north and south poles on the encoder wheel, or adjacent tooth and notch on a toothed wheel (not shown). Typically, for speed applications, the number of pole pairs of the target wheel, which also corresponds to a number of teeth on a tooth wheel) translates into a number of sine waveforms for a full revolution of 360°. For this example, the magnetic encoder wheel 20 would include 24 pole pairs, according to the sinusoidal waveform shown in FIG. 2A. However, FIG. 2B only shows a limited number of pole pairs (4) for the simplicity of representation.

To measure a wheel speed (e.g., in an automotive application) the encoder wheel 20 is used in combination with the magnetic speed sensor 100. The sensor 100 generates an output signal based on a sensed magnetic field that oscillates between two extrema (e.g., a minimum and maximum) in accordance with the rotation of the encoder wheel. A control unit (e.g., an electronic control unit (ECU), including at least one processor, is able to calculate a wheel-speed and an actual angle of the rotating encoder wheel based on the output signals generated by the sensor circuit 10.

In view of the above, a measurement signal is a measurement of the magnetic field B sensed over time t by the magnetic speed sensor 100, and oscillates between the two extrema as the magnetic encoder rotates. Furthermore, the measurement signal may have an offset from an x-axis in a y-axis direction, and may further be normalized to a common amplitude by processing performed by the sensor circuit 10.

The pulses of an output signal may be generated by signal protocol block 15 upon the detection of a crossing of a switching point (i.e., a switching threshold) of the measurement signal provided by the signal conversion algorithm block 13. The switching point, stored in memory 14 (e.g., in a look-up table), is located between the minimum (min) and the maximum (max) of the magnetic field B.

Furthermore, the sensor circuit 10, for example, via the signal conversion algorithm block 13, may regularly and autonomously (re)calculate the switching point and self-calibrate the switching point based on an average of one or more minima and one or more maxima of the measured magnetic field, or based on the calculated speed (e.g., frequency) of one or more sensor signals or measurement signals.

For example, the switching point may be calculated as an average of the most recent minimum and maximum values of the measurement signal, and adjusted accordingly. Alternatively, the switching point may be adjusted based on a value of the speed signal and determined from a look-up table that stores speed values and corresponding switching points. By adapting the switching point on a continual and dynamic basis, the accuracy of the switching point is maintained in a desired region in accordance with fast changes of the measurement signal and assures that a good jitter performance is achieved.

Figure 3A:
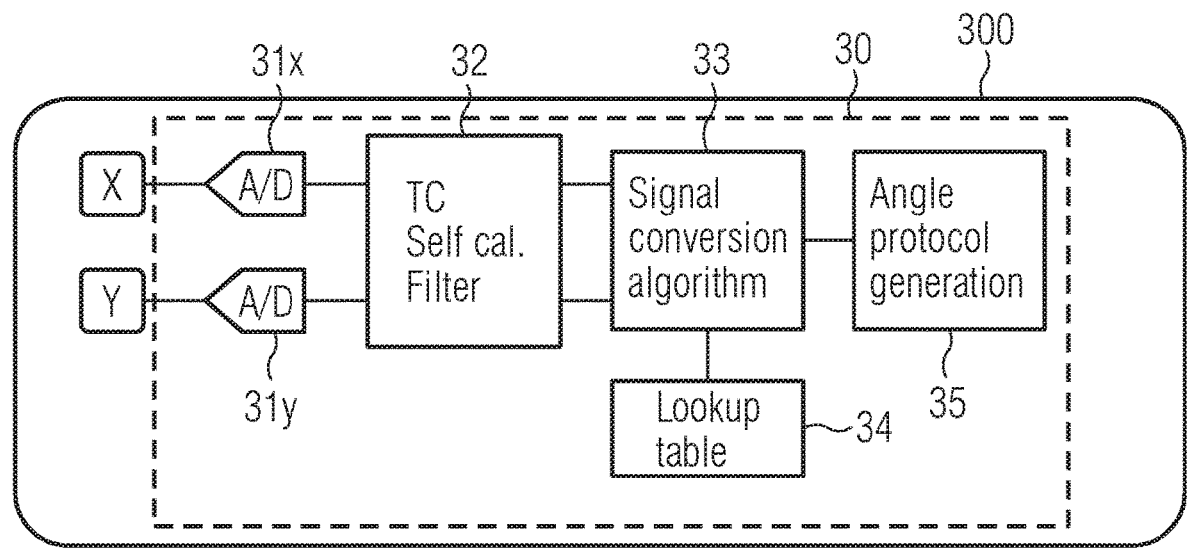
FIG. 3A is a block diagram illustrating a magnetic angle sensor according to one or more embodiments.

FIG. 3A is a block diagram illustrating a magnetic angle sensor 300 according to one or more embodiments. The magnetic speed sensor 300 includes sensor elements X and Y that are configured to generate a sensor signal in response to a magnetic field impinging thereon.

The sensor elements X and Y may be arranged such that sensor element X and sensor element Y are set apart from each other by a predetermined distance such that two sensor signals are generated that are phase shifted from each other by 90°. In this case, the X sensor element and the Y sensor element may be lateral Hall sensor elements such that the sensor element X is configured to sense the sine angle component (e.g., x-component) of the magnetic field and the sensor element Y is configured to sense the cosine angle component (e.g., y-component) of the magnetic field.

Alternatively, sensor elements X and Y may each represent a resistor bridge each including four sensor elements (e.g., xMR sensor elements). In particular, a first resistor bridge X includes four sensor elements (e.g., xMR sensor elements) with different magnetization directions for deriving a sine angle component (e.g., x-component) of the magnetic field and a second resistor bridge Y includes four sensor elements (e.g., xMR sensor elements) with different magnetization directions for deriving a cosine angle component (e.g., y-component) of the magnetic field.

Figure 3B:
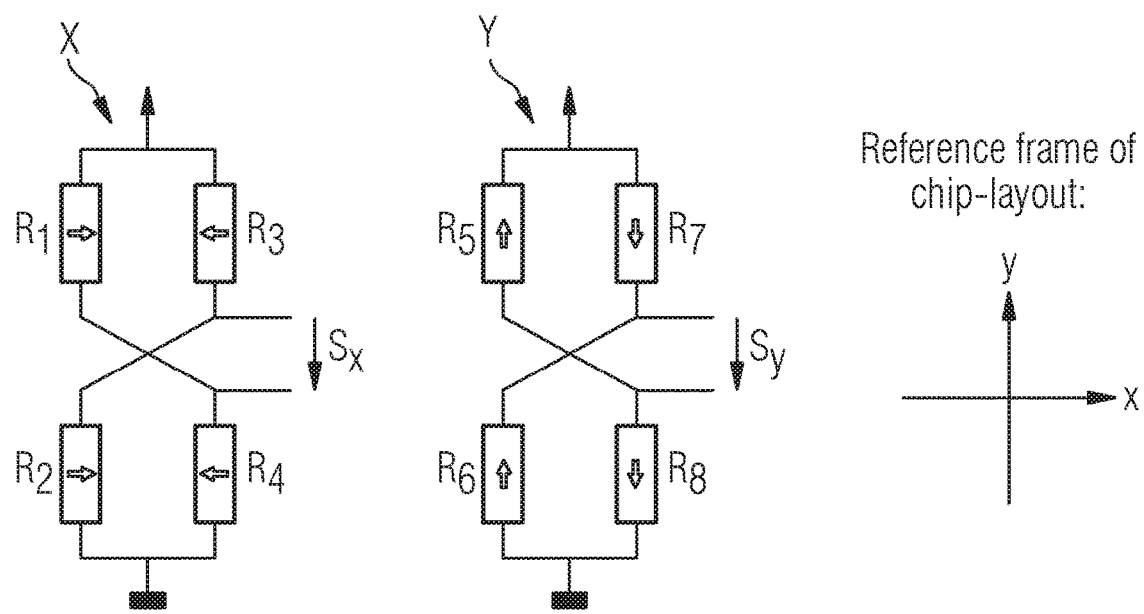
FIG. 3B is a schematic diagram of X and Y sensor bridges of the magnetic angle sensor illustrated in FIG. 3A.

For example, FIG. 3B illustrates an example of a first resistor bridge X that generates sensor signal Sx and includes four xMR sensor elements R1, R2, R3, and R4 with arrows provided to denote a direction of a pinned-layer magnetization of each sensor element aligned in the x-direction. FIG. 3B further illustrates an example of a second resistor bridge Y that generates sensor signal Sy and includes four xMR sensor elements R5, R6, R7, and R8 with arrows provided to denote a direction of a pinned-layer magnetization of each sensor element aligned in the y-direction.

Each sensor element of the first resistor bridge X is arranged on the angle sensor 300 at a substantially same position as a corresponding one of the sensor elements of the second resistor bridge Y. Thus, each resistor bridge outputs a sensor signal that is phase shifted from the other resistor bridge by 90 degrees.

It will be appreciated that other arrangements of sensor elements and use of other types of sensor elements are possible, and are not limited to the above examples, so long as the two measurement signals are phase shifted 90° from each other.

The magnetic angle sensor 300 also includes a sensor circuit 30 that receives the sensor signals from the sensor elements X and Y for processing and for generation of an angle output signal. The sensor circuit 30 includes two signal paths: an X signal path and a Y signal path. The signal-X on the X signal path may be in a form of a sinusoidal (sine) waveform that represents an angular orientation of the target object, and the signal-Y on the Y signal path may be a similar waveform that is shifted 90° from signal-X. That is, signal-Y is a sinusoidal (cosine) waveform that represents an angular orientation of the target object. It will be appreciated that while the examples herein describe the sine waveform as being used as signal-X and the cosine waveform as being used as signal-Y, the opposite may also be true so long as the two signals are phase shifted 90° from each other.

Signal paths X and Y may include an ADC 31x and an ADC 31y, respectively, that convert the measurement signal of the respective signal path into a digital signal for further processing by a remaining portion of the sensor circuit 30.

In addition, a temperature compensation (TC), self-calibration, and filter block 32 may receive each of the measurement signals X and Y, and perform one or more signal conditioning operations thereof before outputting the measurement signals X and Y to signal conversion algorithm block 33.

The signal conversion algorithm block 33 is configured to receive signal-X and signal-Y for further processing. For example, the signal conversion algorithm block 33 may include one or more processors and/or logic units that performs various signal conditioning functions, such as absolute signal conversion, normalization, linearization, frequency increase, and so forth. One or more signal conditioning functions may be performed in combination with a lookup table stored in memory 34. The output of the signal conversion algorithm block 13 is provided an angle protocol block 35 that is configured to generate an angle signal as an output signal. Each "block" may include one or more processors for processing one or more signals.

Figure 4A:
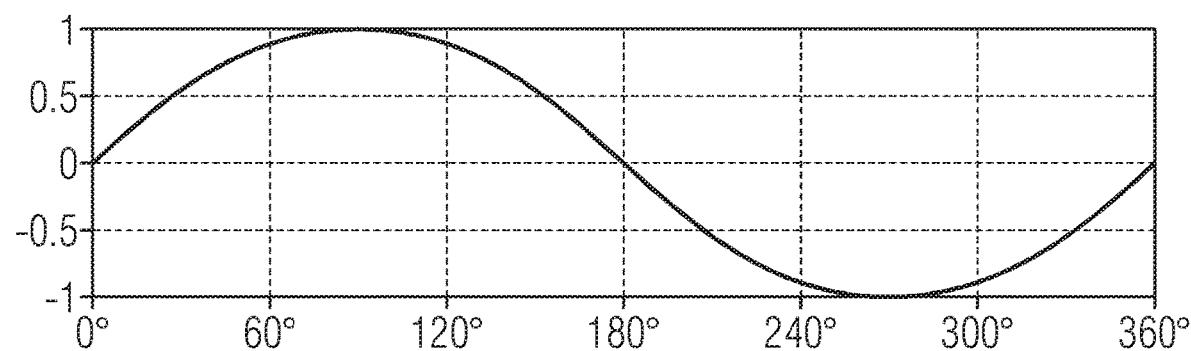
FIG. 4A is a graph showing an example of a sinusoidal waveform generated by a magnetic angle sensor according to one or more embodiments.
Figure 4B:
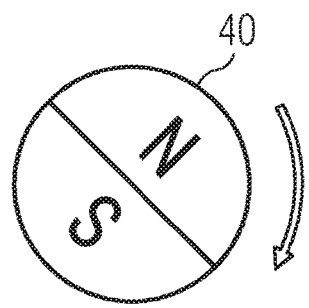
FIG. 4B is a plan view of a magnetic target using in angle sensing according to one or more embodiments.

FIG. 4A is an example of a sinusoidal waveform generated by a magnetic angle sensor according to one or more embodiments. FIG. 4B is a plan view of a magnetic target 40, including a north pole and a south pole, that is configured to rotate about an axis according to one or more embodiments. In particular, FIG. 4A shows a full revolution angle sensor signal response of one full revolution of the magnetic target 40. The angle sensor signal response may be a sensor signal generated by a sensor element (e.g., resistor bridge X or resistor bridge Y), or a combination thereof. The magnetic target 40 may be a magnet, a magnetic pill, a wheel, a shaft, and the like, but is not limited thereto.

To measure an angular position (e.g., in an automotive application) the magnetic target 40 is used in combination with the magnetic angle sensor 300. The sensor 300 generates an output signal based on a sensed magnetic field that oscillates between two extrema (e.g., a minimum and maximum) in accordance with the orientation of the magnetic field as the magnetic target 40 rotates. A control unit (e.g., an electronic control unit (ECU), including at least one processor, is able to calculate an absolute angle of the magnetic target 40 based on the output signals generated by the sensor circuit 30.

In view of the above, a measurement signal is a measurement of the magnetic field B sensed over time t by the magnetic angle sensor 300, and oscillates between the two extrema as the magnetic target rotates. Furthermore, the measurement signal may have an offset from an x-axis in a y-axis direction, and may further be normalized to a common amplitude by processing performed by the sensor circuit 30.

In an anti-lock braking system (ABS), a magnetic sensor may be used in hill holder and parking assistant applications. High accuracy is desired in both applications. However, with 30-60 poles on a standard ABS wheel, the resolution is too low and the ABS magnetic sensor is only capable to detect car movements in the range of 2 cm.

In transmission sensing, a magnetic sensor may also be used for a hillholder application. However, downsizing of the transmission units causes the distance between the pole wheel and the magnetic sensor increases, since the magnetic sensor will be placed outside of the transmission unit. This results in larger distances between magnetic sensor and pole wheel. For such large distances, a strong magnetic field is required which can only be achieved by increasing (e.g., doubling) the pitch on the wheel. With a constant wheel diameter this causes a reduction of the pole pairs (i.e., the sensor will generate half of the pulses). To compensate this behaviour without of the need of software modifications, the transmission sensor should deliver at least double the number pulses.

Angle sensors typically used a combination of sine and cosine signals (i.e., 90° phase shifted signal) to determine the correct angle information based on trigonometric functions (e.g., a tan). An efficient way to do this on an application specific integrated circuit (ASIC) level is by using the so-called COordinate Rotation DIgital Computer (CORDIC) function (also known as Volder's algorithm). The CORDIC function is a simple and efficient algorithm to calculate hyperbolic and trigonometric functions, typically converging with one digit (or bit) per iteration.

The operation of the signal conversion algorithm block 13 and signal conversion algorithm block 33 will now be described in further detail. While the signal conversion algorithm block 13 and the signal conversion algorithm block 33 are described above in different applications (e.g., speed sensing and angle sensing), similar concepts can be applied to both. For example, both signal conversion algorithm blocks 13 and 33 are configured to receive two measurement signals (e.g., sine and cosine) that are phase shifted from each other by 90°. In both applications, the signal conversion algorithm blocks 13 and 33 are configured to increase a number of zero-crossings or a frequency of a measurement signal based on the two phase shifted sensor signals.

With respect to a speed sensing application, it may be desired to increase the number of zero crossings per revolution. For example, an ABS sensor or a transmissions sensor may deliver a protocol (e.g., a generated pulse) on every zero crossing of a measurement signal. If the number of zero crossings per revolution is increased, then the number of pulses per revolution can also be increased.

Figure 5:
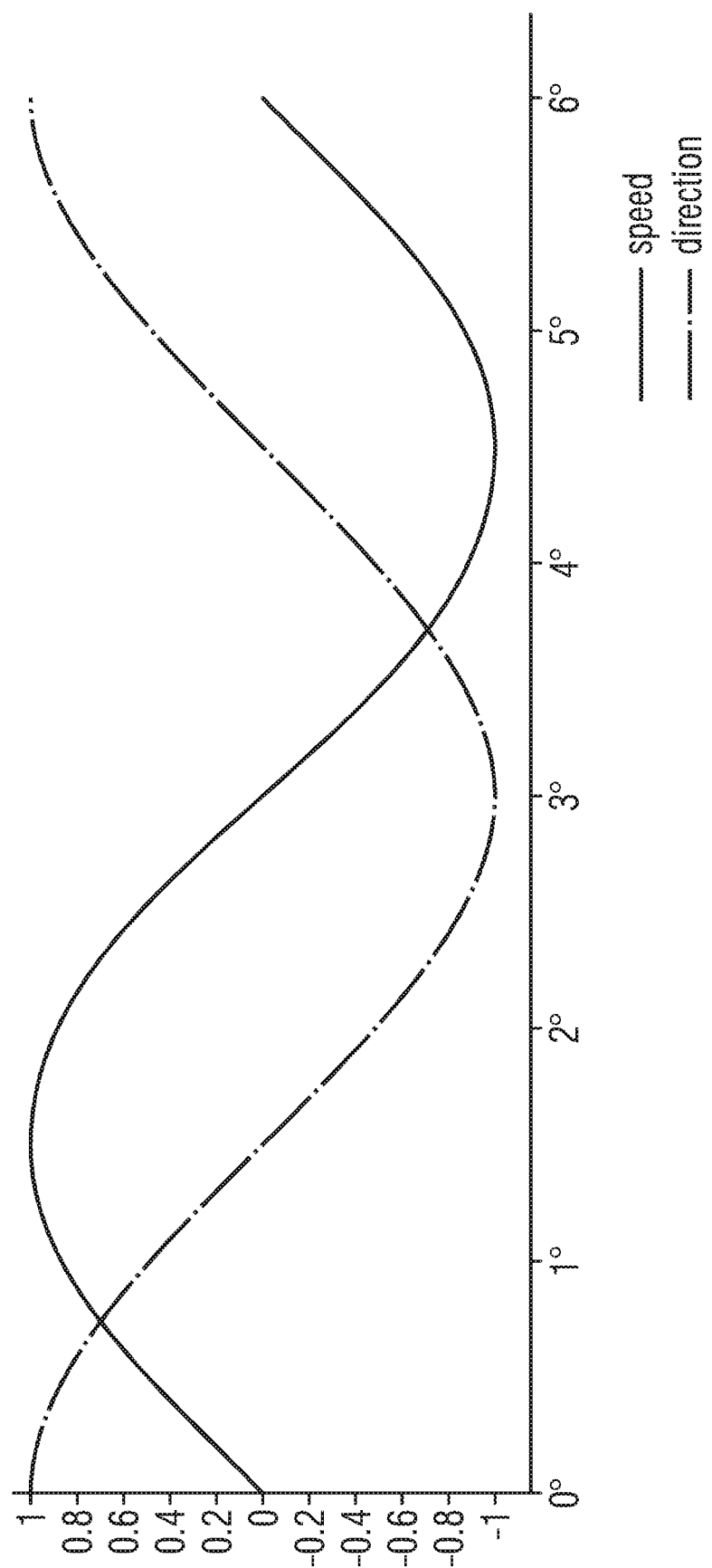
FIG. 5 illustrates sinusoidal waveforms of a speed signal and a direction signal for one pole pair generated by a speed sensor according to one or more embodiments.

FIG. 5 illustrates sinusoidal waveforms of a speed signal and a direction signal for one pole pair (i.e., 6°) generated by a speed sensor according to one or more embodiments. In particular, FIG. 5 shows an example of a speed signal and a direction signal that are input to the signal conversion algorithm block 13 of FIG. 1. The speed and direction channel signals are phase shifted by a half period.

The x-axis of FIG. 5 is shown in degrees)(°, whereas the y-axis shows a normalized value corresponding to millitesias (mT). Assuming to have a reference pole wheel with 60 pole pairs over 360° revolution, each pole pair represents 6° of a full revolution. In its current form, and assuming one pulse is generated at the speed pulse generation block 15 on each zero crossing in the speed path, the speed signal results in two pulses per 6° (e.g., one pulse at 0° and the other pulse at 3°).

It is noted that, the signals shown in FIG. 5 are normalized to a common amplitude for simplification. In a typical application, an amplitude of the speed signal may be 10 mT and an amplitude of the direction signal may be 3 mT. Signal conditioning may be applied by the signal conversion algorithm block 13 to normalize both signals or a difference in the amplitude of the signals should be considered in the calculations presented below. Thus, for the simplicity of explanation, it will be assumed that the speed signal and the direction signal are normalized to a common amplitude hereafter, as shown in FIG. 5, and the signal conversion algorithm block 13 continues to perform post-processing on the normalized signals.

Figure 6:
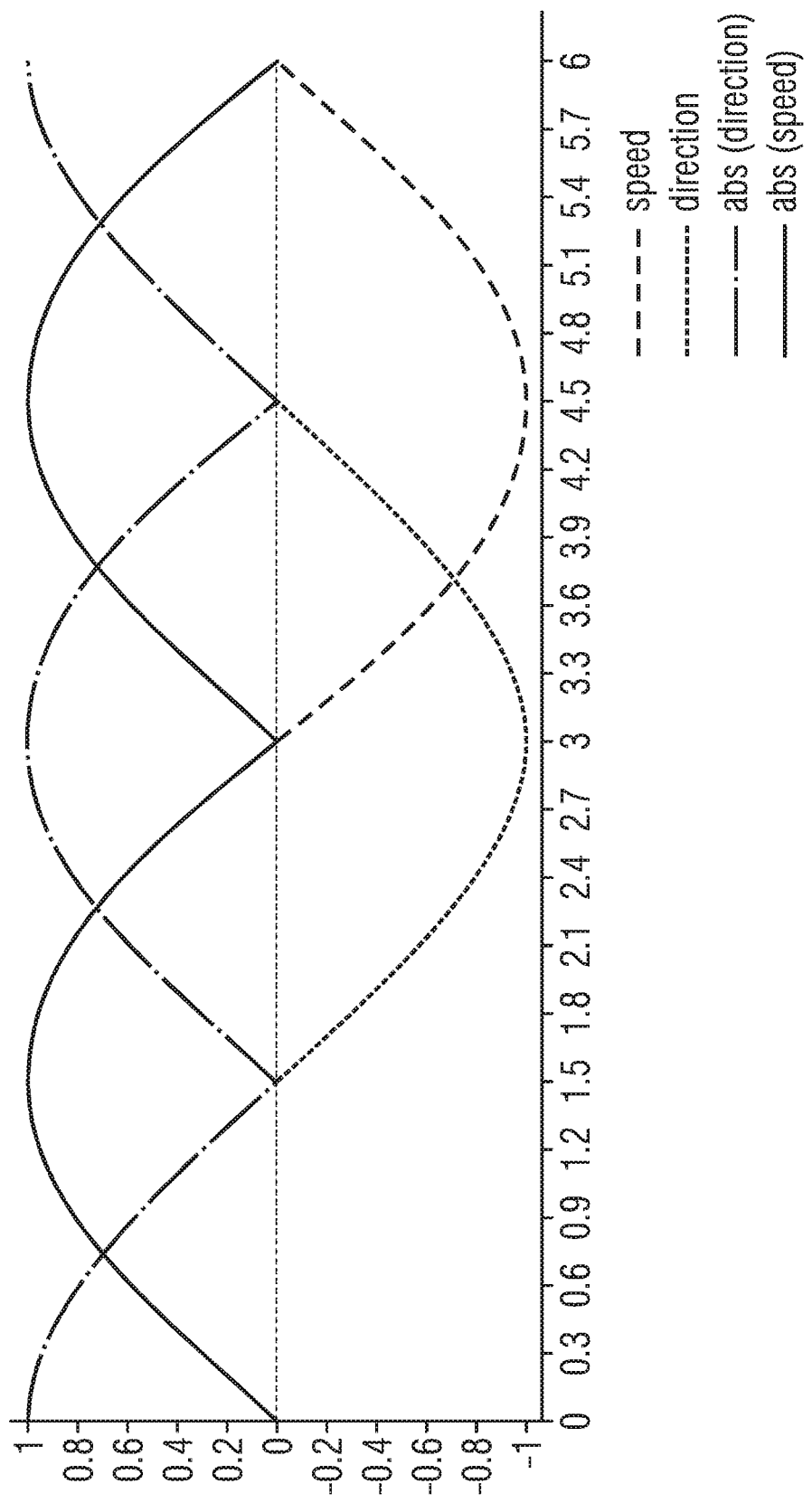
FIG. 6 illustrates absolute values of the sinusoidal waveforms shown in FIG. 5 according to one or more embodiments.

FIG. 6 illustrates absolute values of the sinusoidal waveforms shown in FIG. 5 according to one or more embodiments. In particular, the signal conversion algorithm block 13 is configured to generate the signals abs(speed) and abs(direction) derived from the absolute value of each of the normalized speed signal and the normalized direction signal shown in FIG. 5, respectively.

Figure 7:
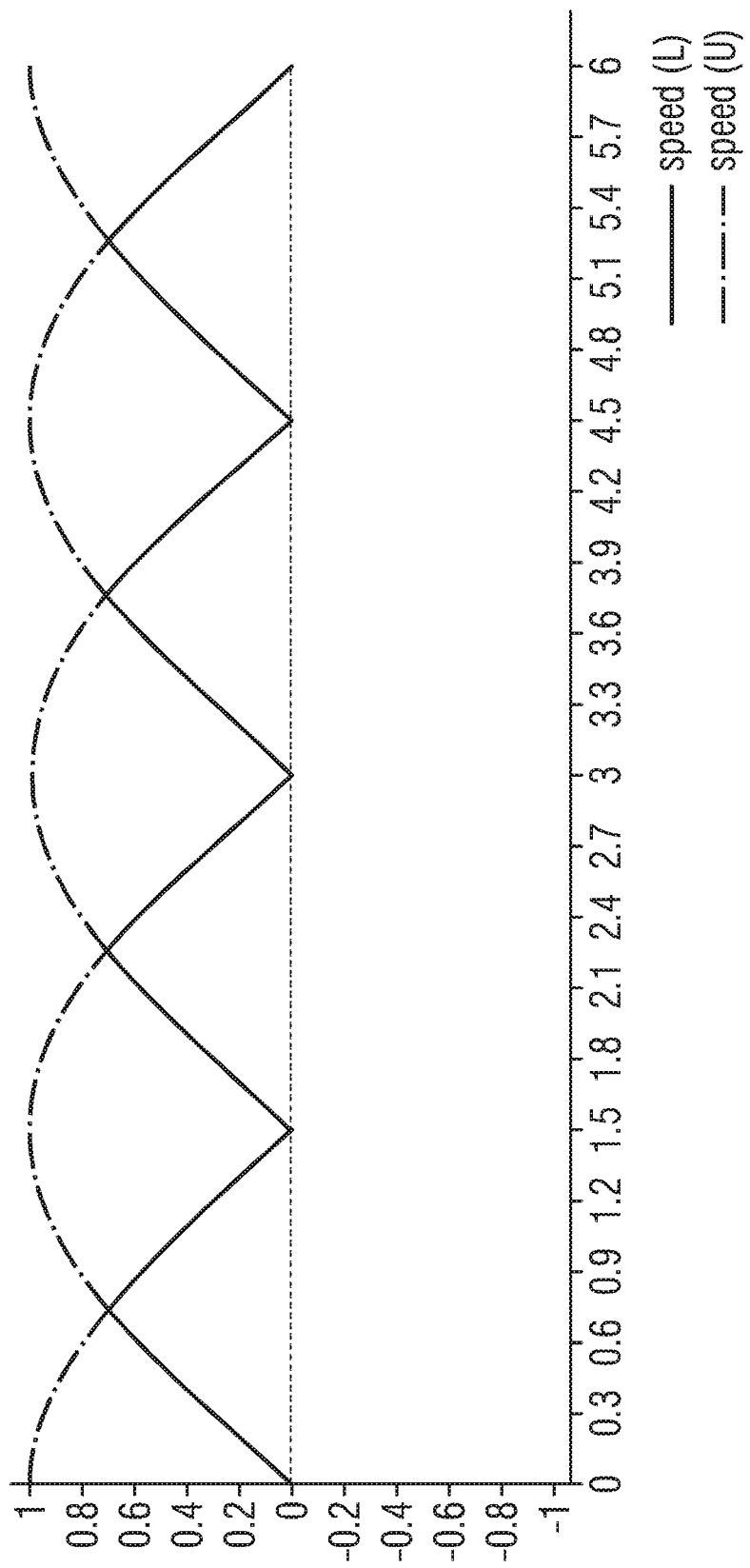
FIG. 7 illustrates a new speed signal waveform derived from the signals shown in FIG. 6 according to one or more embodiments.

FIG. 7 illustrates a new speed signal waveform derived from the signals shown in FIG. 6 according to one or more embodiments. In particular, the new speed signal is a triangular shaped signal with an increased number of zero crossings. The new speed signal may be referred to as speed(L), corresponding to the lower portion of abs(speed) and abs(direction), whereas the remaining portion of the two waveforms of FIG. 7 may form another signal, speed(U), corresponding to the upper portion of abs(speed) and abs (direction).

As shown in FIG. 7, the signal conversion algorithm block 13 is configured to extract the signal speed(L) from the signals abs(speed) and abs(direction) that intersect with each other. For example, the signal conversion algorithm block 13 may apply a non-lineal function or calculation to the signals abs(speed) and abs(direction) to derive signal speed(L). The non-linear function may be used, for example, to "track" or "reproduce" in some way the lesser of the signals abs(speed) and abs(direction) to generate the triangular waveform, speed(L). That is, the abs(speed) and abs(direction) signals may be compared to each other, and smaller of the two signals may be used by the signal conversion algorithm block 13 for generating the triangular waveform, speed(L). The remaining portions of the signals abs(speed) and abs (direction) that are not used to form signal speed(L) may be extracted to form signal speed(U).

The rule for the non-linear function in this case to derive signal speed(L) may be described, in the context of FIG. 5, as follows:

Use the speed signal, when direction>speed>0; and

Use the direction signal, when speed>direction>0.

Alternatively, the rule for the non-linear function in this case to derive signal speed(L) may be described, in the context of FIG. 6, as follows:

Use the signal abs(speed), when abs(direction)>abs (speed); and

Use the signal abs(direction), when abs(speed)>abs(direction).

Thus, the function applied to the abs(speed) and abs (direction) signals can be summarized as follows: as long as the direction signal is larger than the speed signal follow the speed path; and once the speed signal is larger than the direction signal, follow the direction path. Depending on the circumstances, the function applied to the abs(speed) and abs(direction) signals may be chosen as a linear function, a non-linear function, or any other suitable function.

Looking at FIG. 7, a person of skill in the art will recognize that it may be of interest for suitable functions to substantially follow one of the abs(speed) and the abs (direction) signals until a turning point of the one of the abs signals is reached. From this first turning point, the function substantially follows the other one of the abs(speed) signal and the abs(direction) signal until a second turning point of the other one of the abs signals is reached. From this second turning point suitable functions would substantially follow the second abs signal until the third turning point is reached. In other words, suitable functions may change which abs signal is substantially being tracked from one turning point to the next.

Various functions may be used to achieve the same or similar result. For example, an interpolation function may be applied to the abs(speed) and abs(direction) signals, such that various points of the lower of the two signals are detected, and the interpolation function (e.g., spline interpolation) may be applied to the sampled values to generate an optimal waveform, e.g., speed(L), with regards to duty cycle. Alternatively, a linear fit may be applied to the sampled values to generate a linearized waveform, e.g., speed(L).

While the waveform speed(L) is illustrated as a triangular signal (or curved triangle), the embodiments described herein are not limited thereto, and other shaped waveforms are possible, for example, to compensate for phase differences. Thus, the signal(s) generated by the signal conversion algorithm block 13 by applying one or more functions described above may generally be referred to as a converted signal.

Alternatively, signal conversion algorithm block 13 may be configured to extract the signal speed(U) from the signals abs(speed) and abs(direction) in a similar manner. For example, a non-linear function may be applied to the abs(speed) and abs(direction) signals such that: as long as the direction signal is larger than the speed signal follow the direction path; and once the speed signal is larger than the direction signal, follow the speed path. Thus, a triangular waveform, speed(U), may be generated by applying similar principles above. However, extracting the signal speed(L) may be more desirable since the lower portion of the signals abs(speed) and abs(direction) is naturally akin to a triangular shaped waveform and require less processing and estimating.

Figure 8:
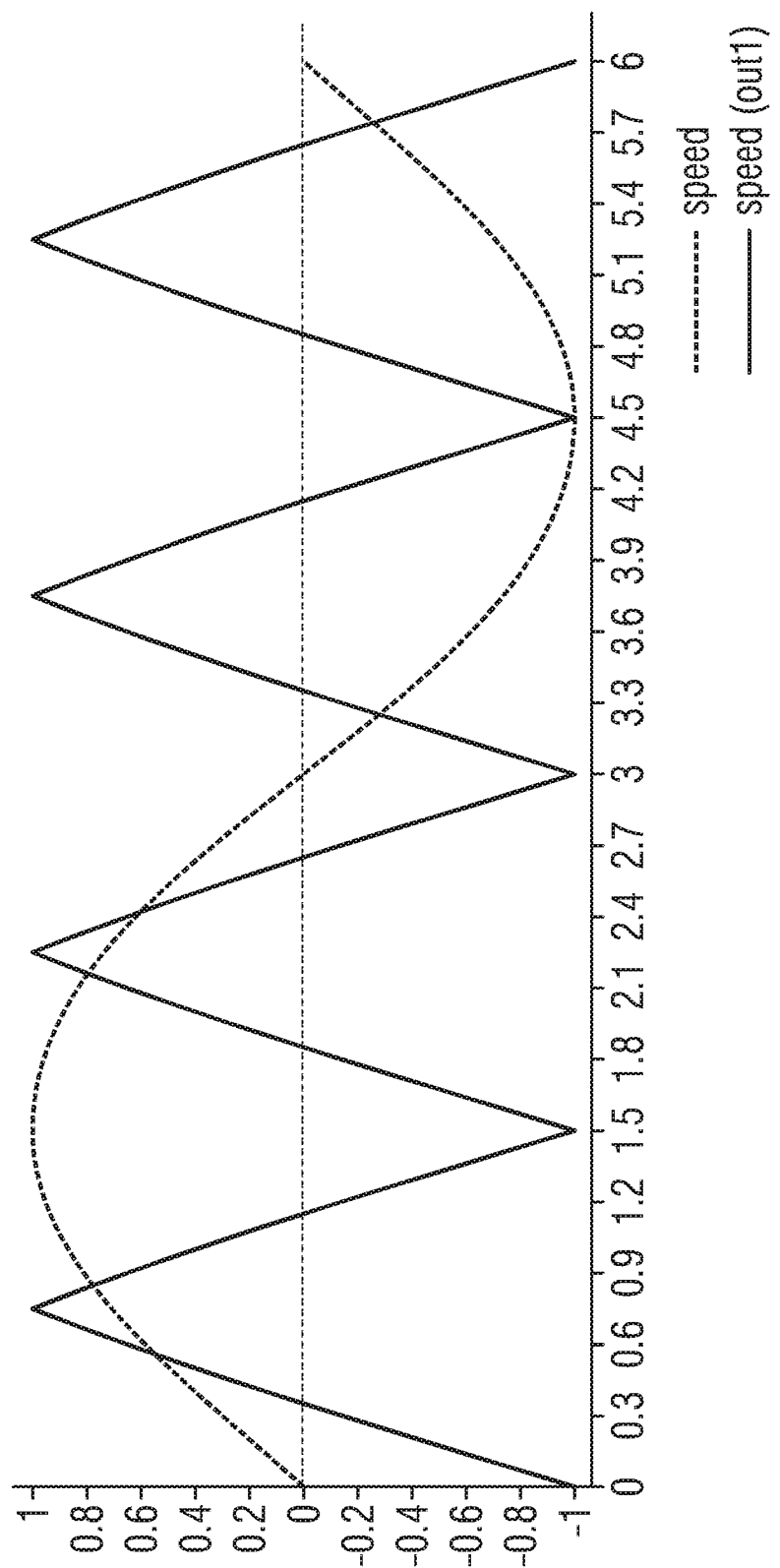
FIG. 8 illustrates a normalized signal of the triangular waveform shown in FIG. 7 according to one or more embodiments.

FIG. 8 illustrates a normalized signal of the triangular waveform shown in FIG. 7 according to one or more embodiments. In particular, signal speed(out1) is a normalization of the triangular shaped signal, speed(L), and is provided to the speed pulse generation block 15 to generate the pulsed output signal based on one or more switching thresholds.

If the signal speed(out1) is compared with the initial speed signal, it can be seen that the number of zero crossings is increased from two per pole pair to eight per pole pair. Thus, if delivering one pulse on every rising edge or on every falling edge of signal speed(out1), the speed pulse generation block 15 would provide four pulses per pole pair. Moreover, if delivering one pulse on both rising edges and falling edges of signal speed(out1), the speed pulse generation block 15 would provide eight pulses per pole pair.

Due to slightly non-linearities of the sine and cosine function, the zero crossings may no longer be well distributed around the 6° of a pole pair. That is, the duty cycle may be irregular and may cause performance issues. Wave shaping or adjustment of the switching threshold may be applied to compensate for this effect.

For example, as mentioned above, wave shaping may be performed on signal speed(L) to convert the signal into a more ideal triangular waveform to, for example, linearize the signal. Alternatively, the wave shaping processing may be applied to signal speed(out1) on an ongoing, real-time basis for similar reasons. In either case, a single switching threshold (e.g., at zero) may be used by the speed pulse generation block 15 to generate the pulsed output signal, and this switching threshold may not need adjusting due to the wave shaping performed on signal speed(out1).

Alternatively, the switching threshold may be adjusted on a dynamic, real-time basis to compensate for irregularities of the duty cycle in signal speed(out1). In particular, a look up table may be used, and depending on an input value of the speed signal (or direction signal) from FIG. 5, the switching threshold applied by the speed pulse generation block 15 for the signal speed(out1) may be adjusted above or below zero. For example, the look up table may map different speed values (or frequency values) to different switching thresholds, and the speed pulse generation block 15 may selectively apply a switching threshold that corresponds to a current speed value or frequency value such that the switching threshold is adjusted to compensate for any irregularities.

In addition, two switching thresholds may be applied and adjusted using a similar principle. For example, a upper switching threshold, maintained above zero, may be used for generating a pulse at a rising edge crossing of the signal speed(out1), the pulse being triggered when the signal speed(out1) crosses the upper switching threshold on a rising edge. Also, a lower switching threshold, maintained below zero, may be used for generating a pulse at a falling edge crossing of the signal speed(out1), the pulse being triggered when the signal speed(out1) crosses the lower switching threshold on a falling edge. Accordingly, one or more look up tables may map different speed values (or frequency values) to both an upper switching threshold and a lower switching threshold, and each of the upper switching threshold and the lower switching threshold may be adjusted based on a current speed value or frequency value to compensate for any irregularities.

Alternatively, instead of using a speed value of the speed signal to adjust one or both of the switching thresholds, a self-learning algorithm may be applied. For example, the dual thresholds may be adjusted by trial-and-error until a desired/correct duty cycle is achieved at the output.

The above embodiments demonstrate that a number of zero crossings per pole pair can be increased from two to eight. In addition, the following embodiments demonstrate that the number of zero crossings per pole pair can be increased from two to sixteen.

Figure 9:
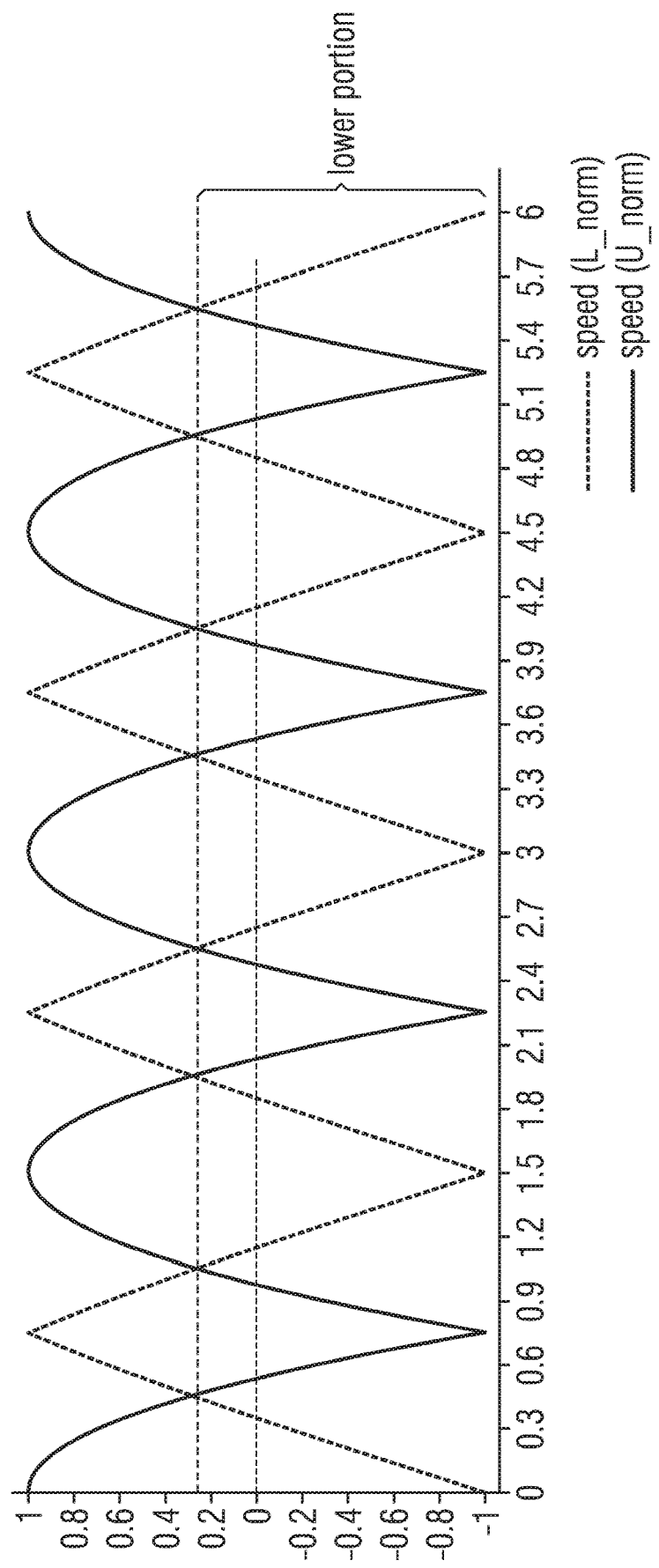
FIG. 9 illustrates normalized speed signals derived from the signals shown in FIG. 7 according to one or more embodiments.

Referring back to FIG. 7, signals speed(L) and speed(U) were generated by the signal conversion algorithm block 13 from the signals illustrated in FIG. 6. After signals speed(L) and speed(U) are generated, the two signals can be normalized, as shown in FIG. 9. Thus, FIG. 9 illustrates normalized speed signals (i.e., speed(L_norm) and speed(U_norm)) derived from signals speed(L) and speed(U) shown in FIG. 7.

Once speed(L) and speed(U) are normalized, the signal conversion algorithm block 13 is configured to extract a lower portion of the two intersecting signals, signals speed (L_norm) and speed(U_norm), in a similar manner that was used to extract or generate signal speed(L) as described with respect to FIG. 7. For example, the signal conversion algorithm block 13 may be configured to compare the signals speed(L_norm) and speed(U_norm) shown in FIG. 9 to each other. The smaller of the two signals is used to generate a triangular waveform, speed(out2), shown in FIG. 10, that is used for further signal processing.

While the waveform speed(out2) is illustrated as a triangular signal (or curved triangle), the embodiments described herein are not limited thereto, and other shaped waveforms are possible, for example, to compensate for phase differences. Thus, the signal(s) generated by the signal conversion algorithm block 13 by applying one or more functions described above may generally be referred to as a converted signal.

The signal conversion algorithm block 13 may apply a non-lineal function or calculation to the speed(L_norm) and speed(U_norm) to derive the lower triangular waveform. The non-linear function may be used, for example, to "track" or "reproduce" in some way the lesser of the signals speed(L_norm) and speed(U_norm) to generate the triangular waveform. The rule for the non-linear function in this case to derive the triangular waveform may be described, in the context of FIG. 9, as follows:

Use the signal speed(L_norm), when speed(U_norm)>speed(L_norm); and

Use the signal speed(U_norm), when speed(L_norm)>speed(U_norm).

Figure 10:
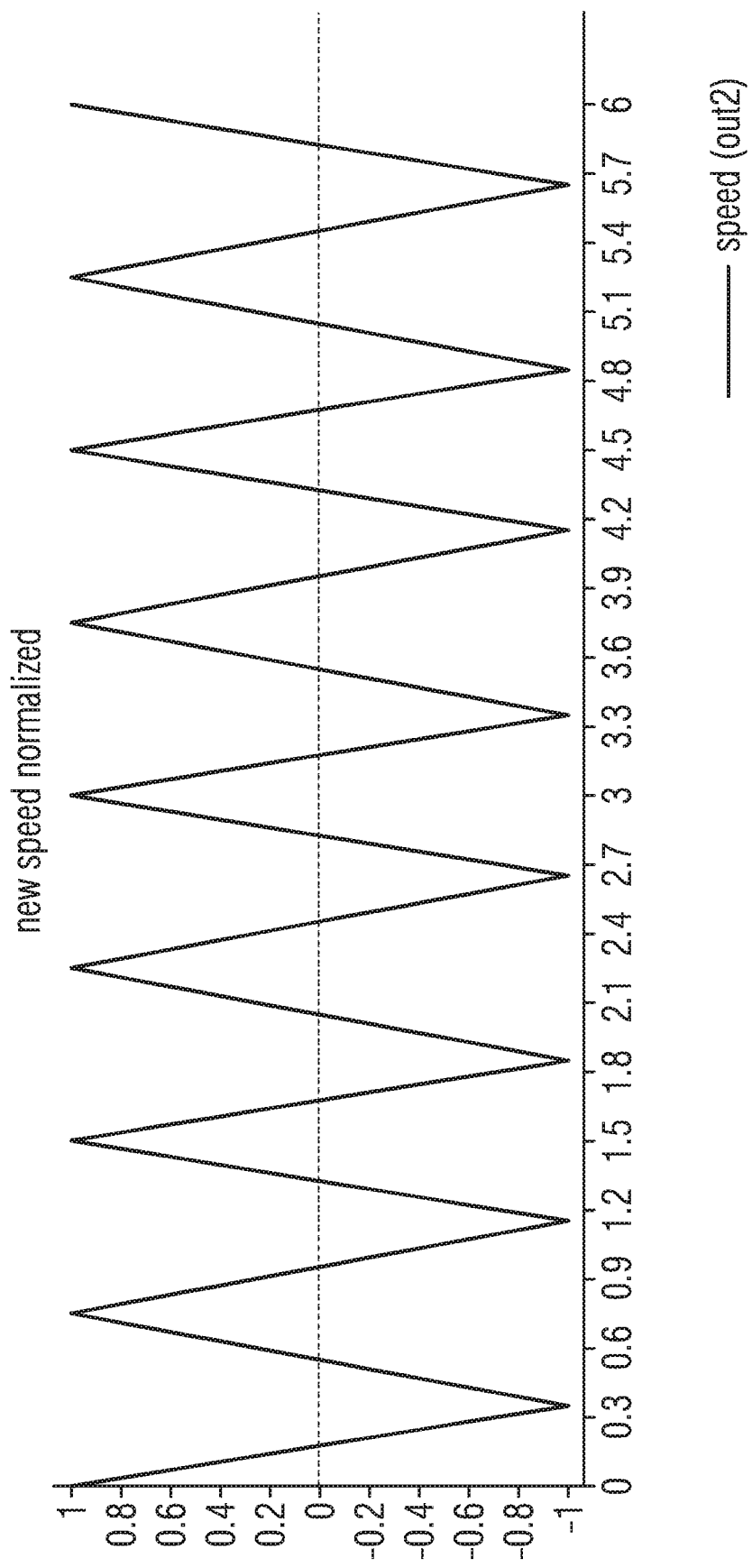
FIG. 10 illustrates a normalized signal of a triangular waveform derived in FIG. 9 according to one or more embodiments.
Figure 11:
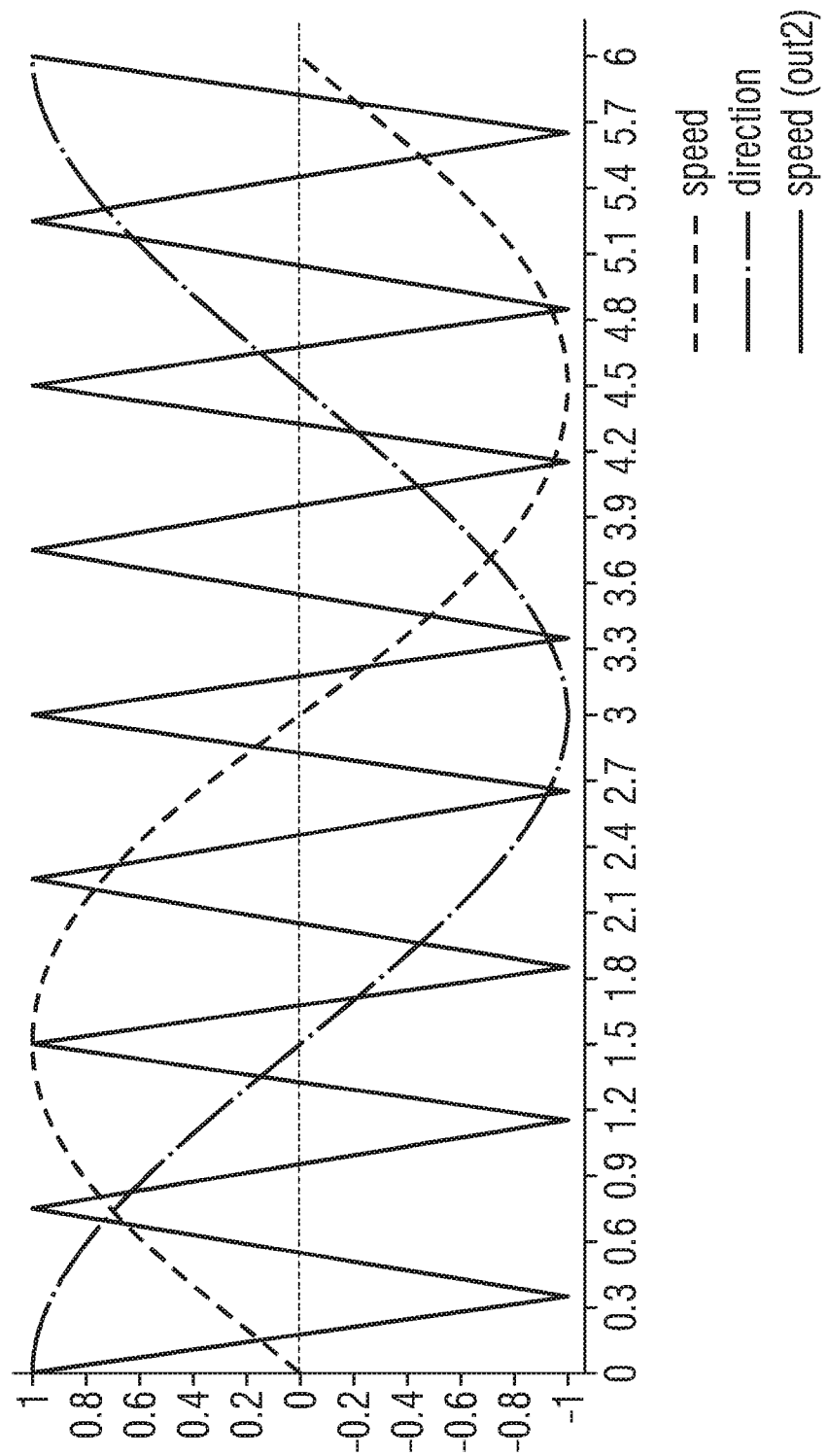
FIG. 11 illustrates the normalized signal of the triangular waveform shown in FIG. 10 together with the original speed signal and the original direction signal shown in FIG. 5 according to one or more embodiments.

FIG. 10 illustrates a normalized signal of the triangular waveform derived in FIG. 9 according to one or more embodiments. FIG. 11 illustrates the normalized signal of the triangular waveform of FIG. 10 together with the original speed signal and the original direction signal shown in FIG. 5. In particular, signal speed(out2) is a normalization of the triangular shaped signal formed by the lower portion of and extracted from signals speed(L_norm) and speed (U_norm), and is provided to the speed pulse generation block 15 to generate the pulsed output signal based on one or more switching thresholds. As can be observed from FIG. 10 and FIG. 11, the number of zero crossings is further increased to sixteen zero crossings per pole p pair.

However, it can also be seen that the signal speed(out2) may also have some unwanted phase shifts and an irregular duty cycle resulting in higher period jitter. This problem of inaccuracy could then be compensated again by similar methods described above that were used to compensate for irregularities of the duty cycle in signal speed(out1). In particular, wave shaping to an ideal triangular waveform or an adjustment of one or more switching thresholds based on the speed and/or direction signal may be applied to compensate for this effect.

By using the approaches described above to generate the new output signals speed(out1) and speed(out2), the new output signals speed(out1) and speed(out2) can no longer be used for rotation direction detection using traditional direction detection concepts. One solution may be to use the original speed and direction signals shown in FIG. 5 in combination with one of the new output signals speed(out1) or speed(out2) for rotation direction detection. Since similar principles apply when using signals speed(out1) or speed(out2) for rotation direction detection, the procedure will be described only in reference to signal speed(out1).

Figure 12:
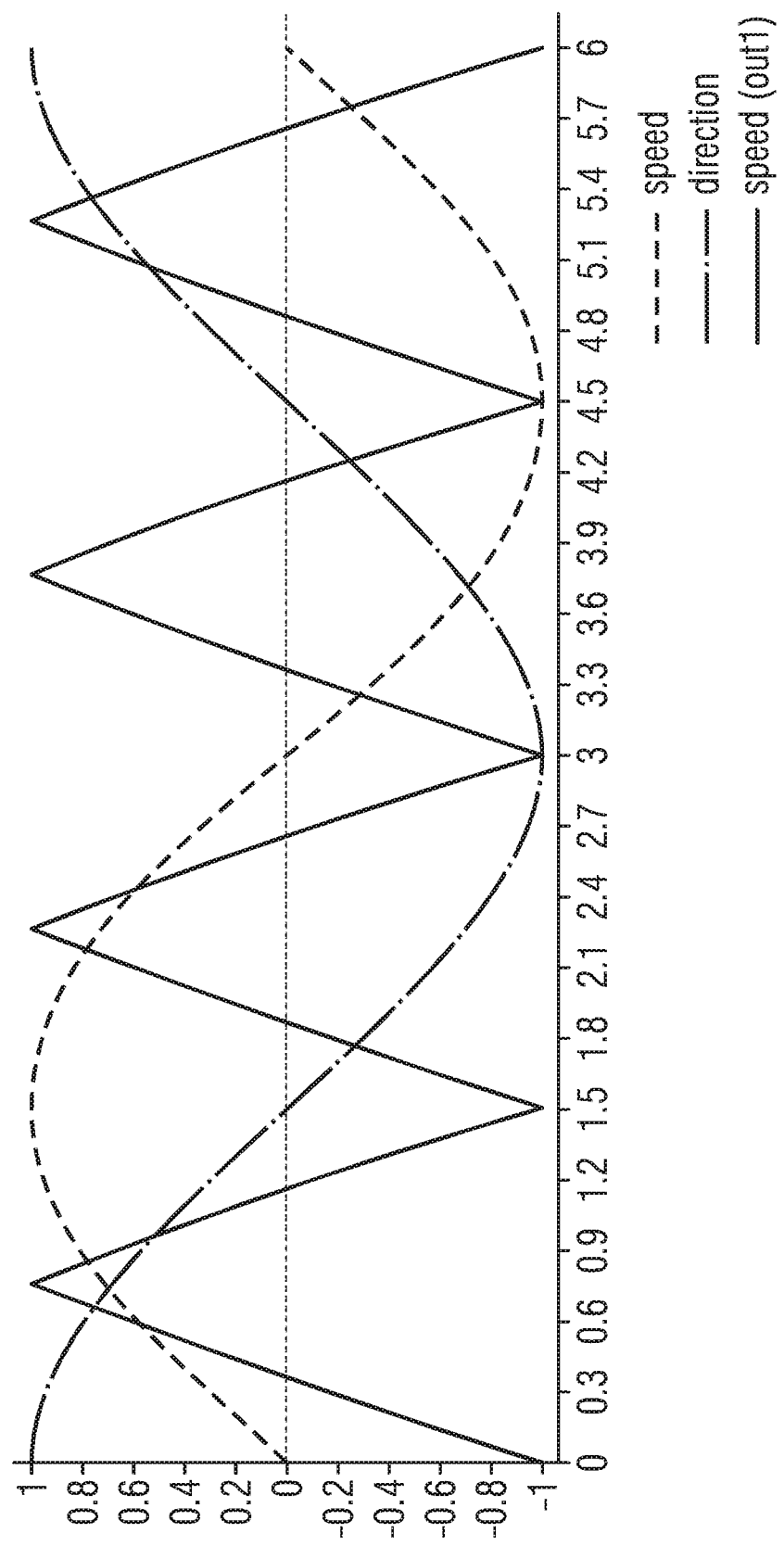
FIG. 12 illustrates an output signal shown in FIG. 8 together with the original speed and direction signals shown in FIG. 5 according to one or more embodiments.

FIG. 12 illustrates the output signal, speed(out1), shown in FIG. 8 together with the original speed and direction signals shown in FIG. 5. Rotation direction detection may be performed by the speed pulse generation block 15 by evaluation the original speed and direction signals on every zero crossing of the output signal, speed(out1). A change of rotation direction can be detected by comparing the speed and direction signal on every zero crossing of the output signal, speed(out1). If the values of both the speed and direction signals remain the same when compared to last sampling, a change of rotation direction is detected. However, if at least one of the values of the speed or direction signals has changed, then no change of rotation direction occurred.

For example, the speed pulse generation block 15 may be configured to take a sample of the values of the speed and direction signals at a first zero-crossing of speed(out1), store the values, and take a sample of the values of the speed and direction signals at the next (second) zero-crossing of speed (out1), store the values, and compare these values with the previously stored values. If at least one of the values changes, the direction of rotation has remained the same. If both values remain the same compared to the previously stored values, a change in rotation direction has occurred and is detected.

As noted above, rotation direction detection may also be performed using speed(out2) by simply replacing speed (out1) with speed(out2) in the above description.

Figure 13:
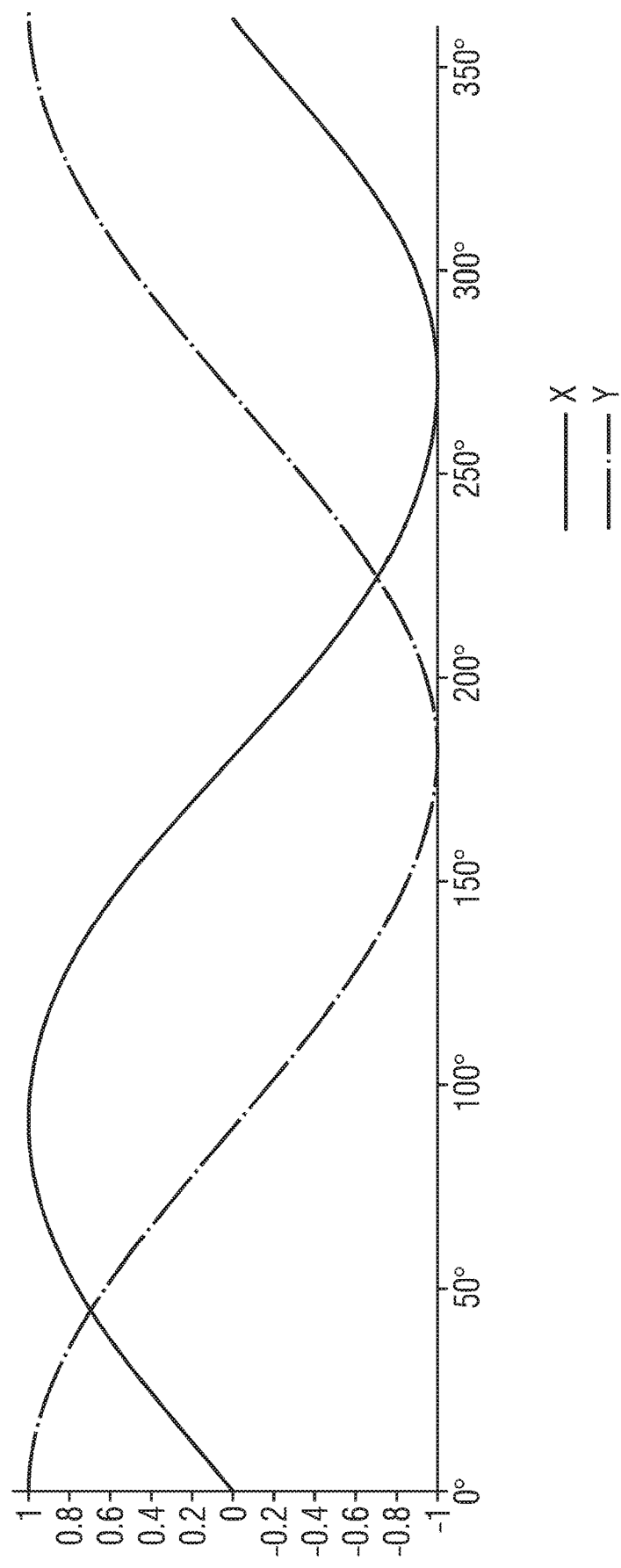
FIG. 13 illustrates angle sensor signal responses according to one or more embodiments.

For an angle sensor application, a combination of a sine measurement signal and a cosine measurement signal are used in order to provide unambiguous angle information. FIG. 13 illustrates angle sensor signal responses according to one or more embodiments. In particular, FIG. 13 shows basic raw data signals generated by the X sensor elements (i.e., the sine measurement signal X) and by the Y sensor elements (i.e., the cosine measurement signal Y). Signal X and Y are input to the signal conversion algorithm block 33 for further processing (e.g., absolute signal conversion, normalization, linearization, and so forth).

Figure 14:
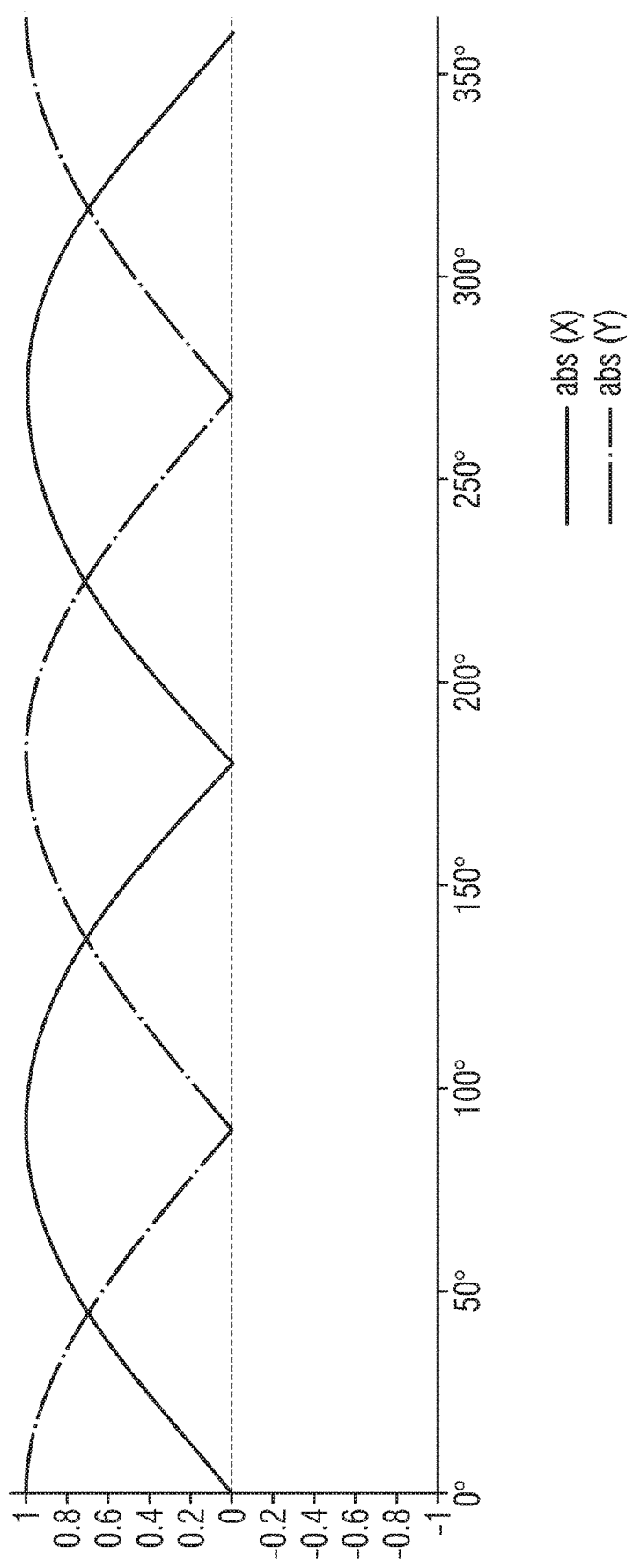
FIG. 14 illustrates absolute values of the sinusoidal waveforms shown in FIG. 13 according to one or more embodiments.

FIG. 14 illustrates absolute values of the sinusoidal waveforms shown in FIG. 13 according to one or more embodiments. In particular, the signal conversion algorithm block 33 receives signals X and Y, and applies an absolute signal conversion thereto to generate signals abs(X) and abs(Y), respectively.

Essentially, the signals illustrated in FIGS. 13 and 14 are identical to the curves shown in FIGS. 5 and 6, respectively, not taking into account the different x-axis scaling. Accordingly, further processing may be performed on signals abs(X) and abs(Y) by the signal conversion algorithm block 33 according to the principles described in reference to FIGS. 7-11. As a result, the concepts described in detail above, can be applied to an angle sensor signal response.

First, the so-called X and Y components (respectively sine and cosine signals) are translated to absolute signals by the signal conversion algorithm block 33, as shown in FIG. 14.

Figure 15:
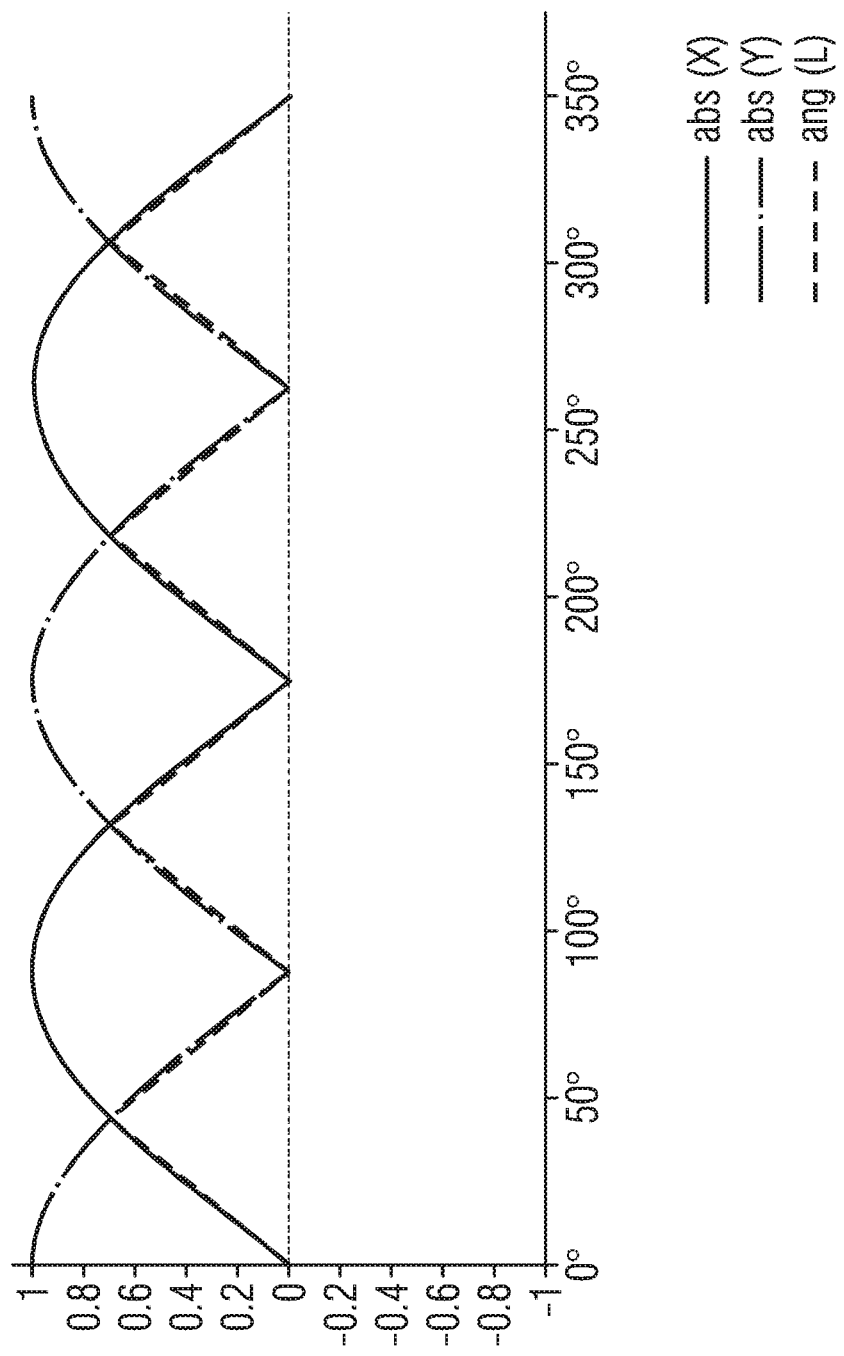
FIG. 15 illustrates a new angle signal waveform derived from the signals shown in FIG. 14 according to one or more embodiments.

Second, as shown in FIG. 15, the absolute X and Y components are compared to each other by the signal conversion algorithm block 33 to extract a lower portion thereof in order to generate signal ang(L). Here, the smaller signal of the two X and Y signals is used for further post processing. The result is a triangular waveform as highlighted in FIG. 15 as the dashed line, which represents the new signal, ang(L). Again, this is identical to the steps described previously on FIGS. 5-8.

The rule for the non-linear function in this case to derive signal ang(L) may be described, in the context of FIG. 15, as follows:

Use the signal abs(X), when abs(Y)>abs(X); and Use the signal abs(Y), when abs(X)>abs(Y).

Thus, only a simple "greater than" condition algorithm is required per signal. In the alternative, it will be appreciated that a "lesser than" condition algorithm may also be used here, and also in the speed sensing application.

Third, the linearized triangular waveform, ang(L), can now be further post-processed and ultimately used by the angle protocol block 35 to calculate absolute angle data. For instance, a simple signal normalization and lookup table data quantization could be applied to obtain the angle information.

While the waveform ang(L) is illustrated as a triangular signal (or curved triangle), the embodiments described herein are not limited thereto, and other shaped waveforms are possible, for example, to compensate for phase differences. Thus, the signal(s) generated by the signal conversion algorithm block 33 by applying one or more functions described above may generally be referred to as a converted signal.

Figure 16:
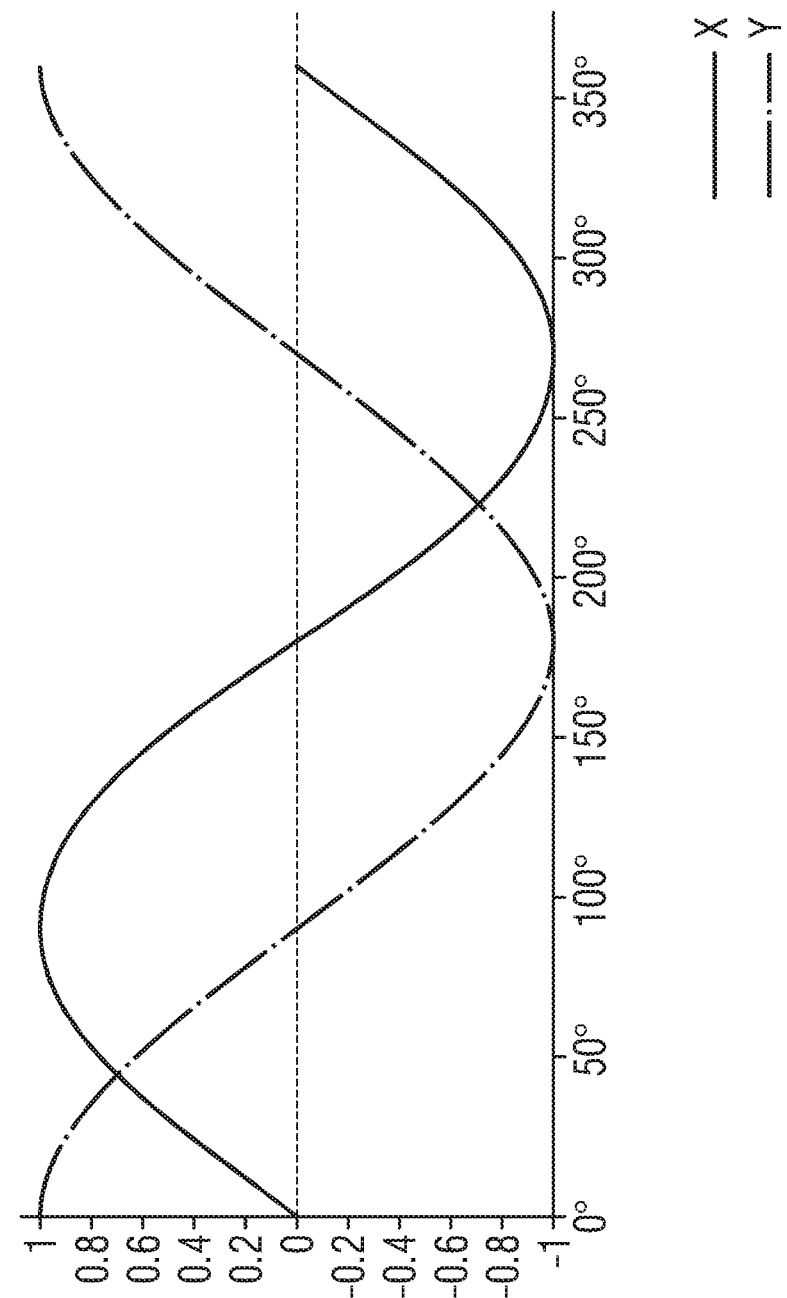
FIG. 16 illustrates angle sensor signal responses, as shown in FIG. 13, according to one or more embodiments.

FIG. 16 illustrates angle sensor signal responses, as shown in FIG. 13, according to one or more embodiments. In particular, signals X and Y may be used to obtain correct 360° angle information due to a loss of this information during the conversion of the angle sensor signal responses into signal ang(L). This loss of information can be observed in FIG. 15 where the signal ang(L) is repetitive from 180° onwards. In order to obtain correct 360° angle information, the original X and Y signals can be used.

In FIG. 16, a possible algorithm applied by the angle protocol block 35 is shown for obtaining the full 360° angle information. For instance, a simple sign check on the X-signal component is sufficient to detect the correct angle range. In other words, if the X-signal is positive, the angle is in the range of 0 to 180°, and, if the X-signal is negative, the angle is in the range of 180° to 360°. Of course, the Y-signal may be used instead, or even both X and Y-signals can be taken into account to detect the correct angle information. For example, if the Y-signal is positive, the angle is in the range of 0 to 90° or 270 to 360°, and, if the Y-signal is negative, the angle is in the range of 90 to 270°.

The signal conversion algorithm applied by the signal conversion algorithm block 33 may be used as a replacement or as a redundancy check of the CORDIC function used by traditional angle sensors.

First, the signal conversion algorithm described herein may be used as a fundamentally different method to calculate angle data. Thus, if redundancy is of interest due to functional safety requirements, the signal conversion algorithm may be used to as a separate, redundant calculation to verify whether the CORDIC calculation is working correctly.

Second, compared to the CORDIC calculation, this method may pose additional advantages such as low latency or additional flexibility in terms of angle accuracy over frequency.

In view of the above, a signal conversion algorithm may be applied to both speed sensing and angle sensing applications in order to increase the number of zero crossings of the measurement signal. Accordingly, the accuracy of each sensing application may be improved, while allowing the structural constraints of the overall system (e.g., size, and/or placement of the target object with respect to the sensor, including air gap) to be relaxed. Offering an algorithm to dynamically increase the resolution offers the flexibility to for instance use a wheel with half the pole numbers, while doubling the number of zero crossings on the chip end to provide the same resolution as a wheel with the full number of poles.

While the above embodiments are described in the context of detecting a wheel or camshaft speed or angle, the sensor may be used to detect the rotation speed or angle of any rotating member or object that creates sinusoidal variations in a magnetic field as it rotates and that may be sensed by a sensor. For example, a combination of a ferrous wheel and a back bias magnet may be used to generate a time varying magnetic field. Alternatively, an active encoder wheel (without a back bias magnetic) may be used to generate a time varying magnetic field.

Further, while various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetic sensor configured to measure a magnetic field whose magnitude oscillates between a first extrema and a second extrema, the magnetic sensor comprising:
a plurality of magnetic field sensor elements, each configured to generate a sensor signal in response to the magnetic field impinging thereon, wherein the plurality of sensor elements are grouped into a first group from which a first measurement signal is derived and a second group from which a second measurement signal is derived, the first measurement signal and the second measurement signal having a phase difference based on different phases; and
a sensor circuit configured to receive the first measurement signal and the second measurement signal, and apply a signal conversion algorithm thereto to generate a converted measurement signal having an increased frequency with respect to a frequency of the first measurement signal and the second measurement signal.

2. The magnetic sensor of claim 1, wherein:
the sensor circuit is configured to apply an absolute value algorithm to both of the first measurement signal and the second measurement signal in order to generate a first absolute value signal of the first measurement signal and a second absolute value signal of the second measurement signal, respectively, and apply a function to the first absolute value signal and the second absolute value signal to derive the converted measurement signal.

3. The magnetic sensor of claim 2, wherein, when generating the converted measurement signal, the first measurement signal and the second measurement signal are normalized to a common amplitude.

4. The magnetic sensor of claim 2, wherein:
the function includes continuously comparing the first absolute value signal with the second absolute value signal over time, and generating the converted measurement signal as the lesser of the first absolute value signal and the second absolute value signal based on the continuous comparison.

5. The magnetic sensor of claim 1, wherein:
the sensor circuit is configured to apply an absolute value algorithm to both of the first measurement signal and the second measurement signal in order to generate a first absolute value signal of the first measurement signal and a second absolute value signal of the second measurement signal, respectively, and generate the converted measurement signal that represents a lesser of the first absolute value signal and the second absolute value signal.

6. The magnetic sensor of claim 1, wherein:
the sensor circuit is configured to shape the converted measurement signal into an optimal converted measurement signal.

7. The magnetic sensor of claim 1, wherein:
the sensor circuit is configured to apply an absolute value algorithm to both of the first measurement signal and the second measurement signal in order to generate a first absolute value signal of the first measurement signal and a second absolute value signal of the second measurement signal, respectively, normalize the first absolute value signal and the second absolute value signal to a common amplitude, and generate the converted measurement signal, the converted measurement signal representing a lesser of the normalized first absolute value signal and the normalized second absolute value signal.

8. The magnetic sensor of claim 1, wherein:
the sensor circuit is configured to compare the converted measurement signal to at least one switching threshold, and generate a pulsed output signal based on the converted measurement signal crossing the at least one switching threshold, wherein the sensor circuit is further configured to adjust the at least one switching threshold based on a frequency of the first measurement signal and the second measurement signal.

9. The magnetic sensor of claim 1, wherein the sensor circuit is further configured to:
detect threshold crossings of the converted measurement signal at at least one switching threshold;
store a value of the first measurement signal and a value of the second measurement signal at the threshold crossings;
compare a current value of the first measurement signal and a current value of the second measurement signal with a previous value of the first measurement signal and a previous value of the second measurement signal, respectively; and
detect a change in rotation direction of the magnetic field based on a condition that the current value of the first measurement signal is the same as the previous value of the first measurement signal and on a condition the current value of the second measurement signal is the same as the previous value of the second measurement signal.

10. The magnetic sensor of claim 1, wherein:
the sensor circuit is configured to determine whether the first measurement signal is positive or negative, and determine an angle range of the converted measurement signal based on whether the first measurement signal is positive or negative.

11. The magnetic sensor of claim 4, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

12. The magnetic sensor of claim 5, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

13. The magnetic sensor of claim 7, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

14. The magnetic sensor of claim 1, wherein:
the first measurement signal, the second measurement signal, and the converted measurement signal are analog signals, and
the sensor circuit is configured to generate the converted measurement signal from the first measurement signal and the second measurement signal in an analog signal processing domain.

15. The magnetic sensor of claim 2, wherein:
the function includes continuously comparing the first absolute value signal with the second absolute value signal over time, and generating the converted measurement signal as the greater of the first absolute value signal and the second absolute value signal based on the continuous comparison.

16. The magnetic sensor of claim 1, wherein:
the sensor circuit is configured to apply an absolute value algorithm to both of the first measurement signal and the second measurement signal in order to generate a first absolute value signal of the first measurement signal and a second absolute value signal of the second measurement signal, respectively, and generate the converted measurement signal that represents a greater of the first absolute value signal and the second absolute value signal.

17. The magnetic sensor of claim 1, wherein:
the sensor circuit is configured to apply an absolute value algorithm to both of the first measurement signal and the second measurement signal in order to generate a first absolute value signal of the first measurement signal and a second absolute value signal of the second measurement signal, respectively, normalize the first absolute value signal and the second absolute value signal to a common amplitude, and generate the converted measurement signal, the converted measurement signal representing a greater of the normalized first absolute value signal and the normalized second absolute value signal.

18. A method of measuring a magnetic field whose magnitude oscillates between a first extrema and a second extrema, the method comprising:
generating a first measurement signal representing the measured magnetic field;
generating a second measurement signal representing the measured magnetic field, wherein the first measurement signal and the second measurement signal have a phase difference based on different phases; and
applying a signal conversion algorithm to the first measurement signal and the second measurement signal in order to generate a converted measurement signal having an increased frequency with respect to a frequency of the first measurement signal and the second measurement signal.

19. The method of claim 18, further comprising:
applying an absolute value algorithm to both of the first measurement signal and the second measurement signal in order to generate a first absolute value signal of the first measurement signal and a second absolute value signal of the second measurement signal, respectively; and
applying a function to the first absolute value signal and the second absolute value signal to derive the converted measurement signal.

20. The method of claim 19, wherein, when generating the converted measurement signal, the first measurement signal and the second measurement signal are normalized to a common amplitude.

21. The method of claim 19, wherein applying the function comprises:
continuously comparing the first absolute value signal with the second absolute value signal over time; and
generating the converted measurement signal as the lesser of the first absolute value signal and the second absolute value signal based on the continuous comparison.

22. The method of claim 18, further comprising:
applying an absolute value algorithm to both of the first measurement signal and the second measurement signal in order to generate a first absolute value signal of the first measurement signal and a second absolute value signal of the second measurement signal, respectively; and
generating the converted measurement signal that represents a lesser of the first absolute value signal and the second absolute value signal.

23. The method of claim 18, further comprising:
shaping the converted measurement signal into an optimal converted measurement signal.

24. The method of claim 18, further comprising:
applying an absolute value algorithm to both of the first measurement signal and the second measurement signal in order to generate a first absolute value signal of the first measurement signal and a second absolute value signal of the second measurement signal, respectively;
normalizing the first absolute value signal and the second absolute value signal to a common amplitude; and
generating the converted measurement signal, the converted measurement signal representing a lesser of the normalized first absolute value signal and the normalized second absolute value signal.

25. The method of claim 18, further comprising:
comparing the converted measurement signal to at least one switching threshold;
generating a pulsed output signal based on the converted measurement signal crossing the at least one switching threshold; and
adjusting the at least one switching threshold based on a frequency of the first measurement signal and the second measurement signal.

26. The method of claim 18, further comprising:
detecting threshold crossings of the converted measurement signal at at least one switching threshold;
storing a value of the first measurement signal and a value of the second measurement signal at the threshold crossings;
comparing a current value of the first measurement signal with a previous value of the first measurement signal;
comparing a current value of the second measurement signal with a previous value of the second measurement signal; and
detecting a change in rotation direction of the magnetic field based on a condition that the current value of the first measurement signal is the same as the previous value of the first measurement signal and on a condition the current value of the second measurement signal is the same as the previous value of the second measurement signal.

27. The method of claim 18, further comprising:
determining whether the first measurement signal is positive or negative; and
determining an angle range of the converted measurement signal based on whether the first measurement signal is positive or negative.

28. The method of claim 21, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

29. The method of claim 22, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

30. The method of claim 24, wherein the converted measurement signal is a waveform that tracks the first absolute value signal, on a condition that the first absolute value signal is less than the second absolute value signal, and tracks the second absolute value signal, on a condition that the second absolute value signal is less than the first absolute value signal.

31. The method of claim 18, wherein:
the first measurement signal, the second measurement signal, and the converted measurement signal are analog signals, and
applying a signal conversion algorithm is performed in an analog signal processing domain.

32. The method of claim 19, wherein applying the function comprises:
continuously comparing the first absolute value signal with the second absolute value signal over time; and
generating the converted measurement signal as the greater of the first absolute value signal and the second absolute value signal based on the continuous comparison.

* * * * *